United States Patent [19]

Kamiya

[11] Patent Number: 4,628,862
[45] Date of Patent: Dec. 16, 1986

[54] PHOTOCHEMICAL VAPOR DEPOSITION APPARATUS

[75] Inventor: Osamu Kamiya, Machida, Japan

[73] Assignee: Canon Kabushiki Kaisha, Tokyo, Japan

[21] Appl. No.: 715,411

[22] Filed: Mar. 25, 1985

[30] Foreign Application Priority Data

Mar. 30, 1984 [JP] Japan .................. 59-62960

[51] Int. Cl.⁴ ............................... C23C 13/08
[52] U.S. Cl. ......................... 118/724; 118/723; 118/620; 118/641; 118/50.1
[58] Field of Search ............... 118/723, 724, 620, 641, 118/50.1, 719; 427/54.1

[56] References Cited

U.S. PATENT DOCUMENTS 4,371,587 2/1983 Peters .................................. 428/446
4,435,445 3/1984 Allred et al. ...................... 427/54.1
4,496,609 1/1985 McNeilly et al. ..................... 427/55
4,516,527 5/1985 Sugioka ................................ 118/723
4,522,674 6/1985 Ninomiya et al. ............... 118/724 X
4,533,820 8/1985 Shimizu ........................... 118/724 X Primary Examiner—Richard Bueker
Attorney, Agent, or Firm—Fitzpatrick, Cella, Harper & Scinto

[57] ABSTRACT

A photochemical vapor deposition apparatus which includes a reaction chamber, a means for introducing a starting gas for film formation into the reaction chamber and a means for irradiating the starting gas with a light of high energy and deposites a thin film on a substrate placed in the reaction chamber by utilizing the photochemical reaction, characterized in that the apparatus includes a means for heating in advance to high temperature the starting gas to be introduced into the reaction chamber.

3 Claims, 2 Drawing Figures

PHOTOCHEMICAL VAPOR DEPOSITION APPARATUS

BACKGROUND OF THE INVENTION

1. Field of the Invention

This invention relates to a photochemical vapor deposition apparatus, and more particularly to a novel apparatus for producing a vapor deposition thin film by which a thin film of high purity can be formed at a low temperature using a photochemical reaction.

2. Description of the Prior Art

A photochemical vapor deposition apparatus (hereinafter abbreviated as PCVD apparatus) is an apparatus which includes a reaction chamber, a means for introducing starting gas into the reaction chamber and a means for irradiating the starting gas with a light of high energy and by which a thin film is deposited on a substrate placed in the reaction chamber by utilizing the photochemical reaction.

FIG. 1 shows a basic construction of a representative PCVD apparatus employed in the prior art. In FIG. 1, 1 is luminous flux, 2 a window, 3 a reaction chamber, 4 a valve for introducing starting gas, 5 a thin film, 6 a substrate, and 7 an outlet.

The conventional PCVD apparatus of this type can form a film by decomposing the starting gas by use of light energy. For example, there is known a process in which a silane gas introduced into reaction chamber 3 is irradiated with light of high energy such as excimer laser and the like to form a silicon hydride film on the substrate. In this process, since the film is formed only by use of light energy there were defects that the deposition rate is low, the bonding between silicon atoms and hydrogen atoms does not sufficiently proceed and electrical properties of the film formed is insufficient.

For example, the reactions such as those mentioned below may be supposed as the possible reactions for forming silicon hydride by the decomposition of silane gas.

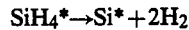
$SiH_4^* \rightarrow Si^* + 2H_2$
$SiH_4^* \rightarrow SiH^* + H_2 + H$ (* shows an excited state.) However, for dissociation of each chemical species, energy of about 10 eV is needed.

For taking such high energy by only using light, it is needed that, for example, a far ultraviolet laser having very light strength is collected through a lens.

Therefore, in the conventional PCVD apparatus, there were defects that formation of the film on large area of the substrate surface is difficult, and in the case of the formation of the film on small area of the surface, the deposition rate is slow.

SUMMARY OF THE INVENTION

An object of the present invention is to provide a PCVD apparatus which is free from the drawbacks of the conventional PCVD apparatus, and can form a film by just low light energy and on a wide area of a substrate surface at a high rate.

According to the present invention, there is provided a photochemical vapor deposition apparatus which includes a reaction chamber, a means for introducing a starting gas for film formation into the reaction chamber and a means for irradiating the starting gas with a light of high energy to a thin film on a substrate placed in the reaction chamber by utilizing the photochemical reaction, characterized in that the apparatus includes a means for heating in advance to high temperature the starting gas to be introduced into the reaction chamber.

DESCRIPTION OF THE PREFERRED EMBODIMENTS

Figure 1:
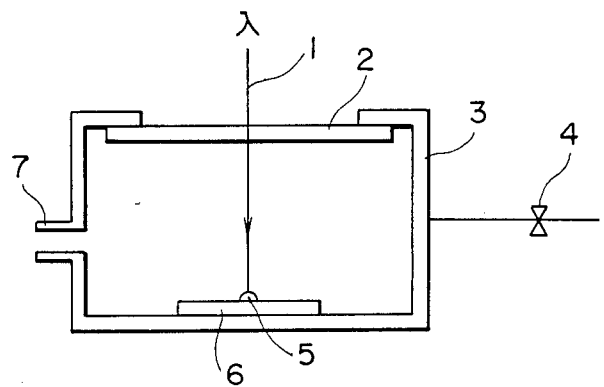
FIG. 1 shows schematically a conventional PCVD apparatus.
Figure 2:
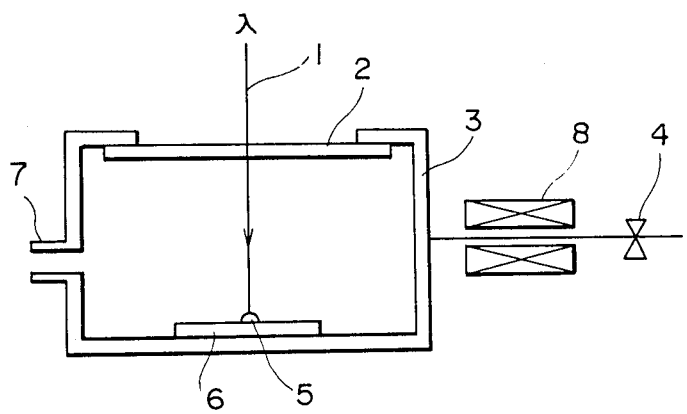
FIG. 2 shows schematically an example of an apparatus of the present invention.

FIG. 2 shows an example of a PCVD apparatus according to the present invention. In FIG. 2, the part corresponding to the part in FIG. 1 is shown by the same mark and the explanation as to the marks is omitted.

As shown in FIG. 2, there is provided the heating device 8 which can heat in advance a starting gas for film formation to be introduced into the reaction chamber 3 to high temperature of 200° C.–1000° C.

The reason for limiting this heating temperature within the above-mentioned range is that, in the case of 200° C. or lower, the gas to be used usually has low photolysis efficiency, while, in the case of 1,000° C. or higher, the heating device would become large in size, because it requires the heat energy at a level higher than necessary, which is not economical (from the standpoint of the manufacturing cost), and, at the same time, makes it unable, for example, to form the amorphous film on account of the film being subjected to the effect of high temperature gas.

In the apparatus as shown in FIG. 2, when introducing through the valve 4 the starting gas for the film formation into the reaction chamber 3, the starting gas is heated by the heating device 8 until the time immediately before it is decomposed. The starting gas is exhausted from the outlet 7 and, thereby, the unused gas can be commonly introduced. The light 1 of high energy is applied through the window 2 on the substrate 6 placed in the reaction chamber 3. By decomposition of the starting gas, the deposition film 5 is deposited on the substrate 6 at high rate.

In the present invention, as the heating device which may be used for heating in advance the starting gas for the film formation, there may be mentioned the usual heating device such as a resistance heating device, an infrared heating device and the like.

These devices may be used separately or in combination. However, considering conformity to the starting gas for the film formation, the device which can efficiently heat in advance the gas is used.

If the object of the present invention can be accomplished, the heating device according to the present invention may placed on any part of the pathway for supplying the starting gas, preferably, it is advantageous to the heating efficiency that the device is placed on the gas supplying pathway as near as possible to the reaction chamber.

The temperature for heating in advance is severally selected corresponding to the starting gas used. In the case where a silane gas and so on is used, about 600° C. is generally suitable.

In the above described example, the means for forming the film by the decomposition of the starting gas is described. Conversely, it is possible that a monomer of an organic starting gas is introduced following the above-mentioned means to form a polymer film by polymerization of the monomer. Alternatively, by an auxiliary procedure by which the substrate is heated, it is expected that quality of the film is improved further.

As explained above, the film according to the present invention may be formed easily by applying just low light energy to the gas molecule activated by heating in advance the starting gas to be introduced into the reaction chamber until the time immediately before it is decomposed, and deposited on the wide area of the substrate surface at the high rate.

What is claimed is:

1. A photochemical vapor deposition apparatus which includes a reaction chamber, a means for introducing a starting gas for film formation into the reaction chamber and a means for irradiating the starting gas with a light of high energy to deposit a thin film on a substrate placed in the reaction chamber by utilizing the photochemical reaction, wherein the apparatus includes a means for heating in advance to high temperature the starting gas to be introduced into the reaction chamber.

2. A photochemical vapor deposition apparatus according to claim 1 wherein the heating means is a resistance heating device.

3. A photochemical vapor deposition apparatus according to claim 1 wherein the heating means is an infrared heating device.

* * * * *

UNITED STATES PATENT AND TRADEMARK OFFICE
CERTIFICATE OF CORRECTION

PATENT NO. : 4,628,862
DATED : December 16, 1987
INVENTOR(S) : OSAMU KAMIYA

It is certified that error appears in the above-identified patent and that said Letters Patent is hereby corrected as shown below:

AT [57] IN THE ABSTRACT

Line 5, "and deposites" should read --to deposit--.

COLUMN 1

Line 66, "to a" should read -- to deposit a--.

COLUMN 2

Line 15, "mark" should read --reference number--.
Line 15, "marks" should read --reference numbers--.
Line 60, "severally" should read --suitably--.

Signed and Sealed this

Thirteenth Day of October, 1987

Attest:

DONALD J. QUIGG

Attesting Officer

Commissioner of Patents and Trademarks